(12) United States Patent
Hirao et al.

(10) Patent No.: US 11,349,494 B2
(45) Date of Patent: May 31, 2022

(54) DATA COMPRESSION APPARATUS AND DATA COMPRESSION METHOD

(71) Applicant: Hitachi, Ltd., Tokyo (JP)

(72) Inventors: Takeshi Hirao, Tokyo (JP); Yuusaku Kiyota, Tokyo (JP); Shoji Kato, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/192,633

(22) Filed: Mar. 4, 2021

(65) Prior Publication Data

US 2022/0131555 A1     Apr. 28, 2022

(30) Foreign Application Priority Data

Oct. 26, 2020   (JP) .............................. JP2020-179138

(51) Int. Cl.
*H03M 7/40*     (2006.01)
*H03M 13/00*    (2006.01)

(52) U.S. Cl.
CPC ..... *H03M 7/4031* (2013.01); *H03M 13/6588* (2013.01)

(58) Field of Classification Search
CPC ................................ H03M 7/40; H03M 13/00
USPC ..................................................... 341/55–95
See application file for complete search history.

(56) References Cited

U.S. PATENT DOCUMENTS

| 5,875,477 | A  | * | 2/1999  | Hasbun ............... G06F 11/1068 714/E11.038 |
| 7,437,641 | B1 | * | 10/2008 | Gorshe ............ G01R 31/31703 714/732 |
| 8,090,586 | B2 | * | 1/2012  | Oh ........................ G10L 19/008 704/500 |
| 9,204,167 | B2 | * | 12/2015 | Boyce .................... H04N 19/61 |
| 10,084,484 | B2 | * | 9/2018 | Nagashima ........... G06F 3/0608 |
| 11,030,063 | B1 | * | 6/2021 | Shipilov ................. G06F 3/067 |
| 2004/0122979 | A1 | * | 6/2004 | Kirkland ............... G06F 40/123 715/256 |
| 2006/0049966 | A1 | * | 3/2006 | Ozawa .................. H04L 1/0045 704/E19.003 |
| 2013/0262914 | A1 | * | 10/2013 | Mao ..................... G06F 11/0793 714/4.2 |
| 2016/0365874 | A1 | * | 12/2016 | Nagashima ....... H03M 13/2906 |
| 2019/0385689 | A1 | * | 12/2019 | Jang ....................... G11C 29/48 |

FOREIGN PATENT DOCUMENTS

JP        6666540   B2    3/2020

* cited by examiner

*Primary Examiner* — Lam T Mai
(74) *Attorney, Agent, or Firm* — Procopio, Cory, Hargreaves & Savitch LLP

(57) ABSTRACT

A compression engine calculates replacement CRC codes, in predetermined data lengths, for DIF-in cleartext data including cleartext data and multiple CRC codes based on the cleartext data. The compression engine generates headered compressed-text data in which a header including the replacement CRC codes is added to compressed-text data in which the cleartext data is compressed, and generates code-in compressed-text data by calculating multiple CRC codes based on the headered compressed-text data to add the calculated CRC codes to the headered compressed-text data.

7 Claims, 11 Drawing Sheets

FIG. 11

| S | Data length [B] | Data error ratio | Data error nondetection probability | Suitability for Allowable condition | Selectabilty of data length |
|---|---|---|---|---|---|
| 1 | 512 | 512 x 8 x BER | 512 x 8 x BER x (1-D) | OK | Selectable |
| 2 | 1024 | 1024 x 8 x BER | 1024 x 8 x BER x (1-D) | OK | Selectable |
| A | 512 x A | 512 x A x 8 x BER | 512 x A x 8 x BER x (1-D) | OK | Selectable |
| A+1 | 512 x (A+1) | 512 x (A+1) x 8 x BER | 512 x (A+1) x 8 x BER x (1-D) | NG | Not Selectable |

DATA COMPRESSION APPARATUS AND DATA COMPRESSION METHOD

CROSS-REFERENCE TO PRIOR APPLICATION

This application relates to and claim the benefit of priority from Japanese Patent Application No. 2020-179138 filed on Oct. 26, 2020 the entire disclosure of which is incorporated herein by reference.

BACKGROUND

The present disclosure relates to a data compression apparatus and a data compression method.

In storage systems for storing data, in general, error detection codes such as CRC (Cyclic Redundancy Check) codes are added to data to enhance the reliability of the data.

In addition, in such storage system, data is deduplicated, compressed, etc., to reduce the amount of data that is stored. However, the compression of data that is nearly random such as error detection codes results in a low compression ratio. This causes a problem that data including error detection codes results in a low efficiency in reducing the amount of the data.

A means for solving this problem may be to simply delete the error detection codes. This approach however decreases the reliability of the data, and thus is unfeasible.

In response, Japanese Patent No. 6666540 discloses a storage control apparatus capable of enhancing the data reduction efficiency while preventing decrease in the reliability. This storage control apparatus separates an error detection code from data that has been checked by the error detection code, and stores the separated error detection code. The storage control apparatus deduplicates and compresses the data from which the error detection code has been separated, generates another error detection code anew from the deduplicated and compressed data, and adds the new error detection code to the data to store the data including the error detection code. Thus, the data is compressed with the error detection code being separated from the data. This enhances the data reduction efficiency, and furthermore, the stored error detection code ensures the reliability of the data after decompression.

SUMMARY

However, the storage control apparatus indicated in Japanese Patent No. 6666540 has two problems. First, the error detection code that was included in the data before the compression needs holding in a different storage area from that for the compressed data. Second, a data processing unit that is not in the vicinity of a storage area that holds the error detection code that was included in the data before the compression (for example, a processing unit or the like of a storage system that is the copy destination of remote copy of the data) cannot check cleartext data when the compressed data is transferred and then decompressed, thus leaving the problem of reliability and portability of the data.

An object of the present invention is to provide a data compression apparatus and a data compression method capable of further enhancing the compression ratio, reliability, and portability of data.

A data compression apparatus according to one embodiment of the present disclosure is a data compression apparatus that compresses code-in cleartext data including cleartext data and multiple first error detection codes based on the cleartext data. The data compression apparatus includes a compression unit that calculates second error detection codes for the code-in cleartext data in predetermined data lengths that are each a predetermined data length, generates headered compressed-text data in which a header including the second error detection codes is added to compressed-text data in which the cleartext data is compressed, and generates code-in compressed-text data by calculating multiple third error detection codes based on the headered compressed-text data to add the calculated third error detection codes to the headered compressed-text data.

The present invention is capable of enhancing the compression ratio, reliability, and portability of data.

BRIEF DESCRIPTION OF THE DRAWINGS

FIG. 11 is an illustration for explaining one example of a method for determining a CRC-replacement data length.

DETAILED DESCRIPTION OF THE EMBODIMENT

Figure 1:
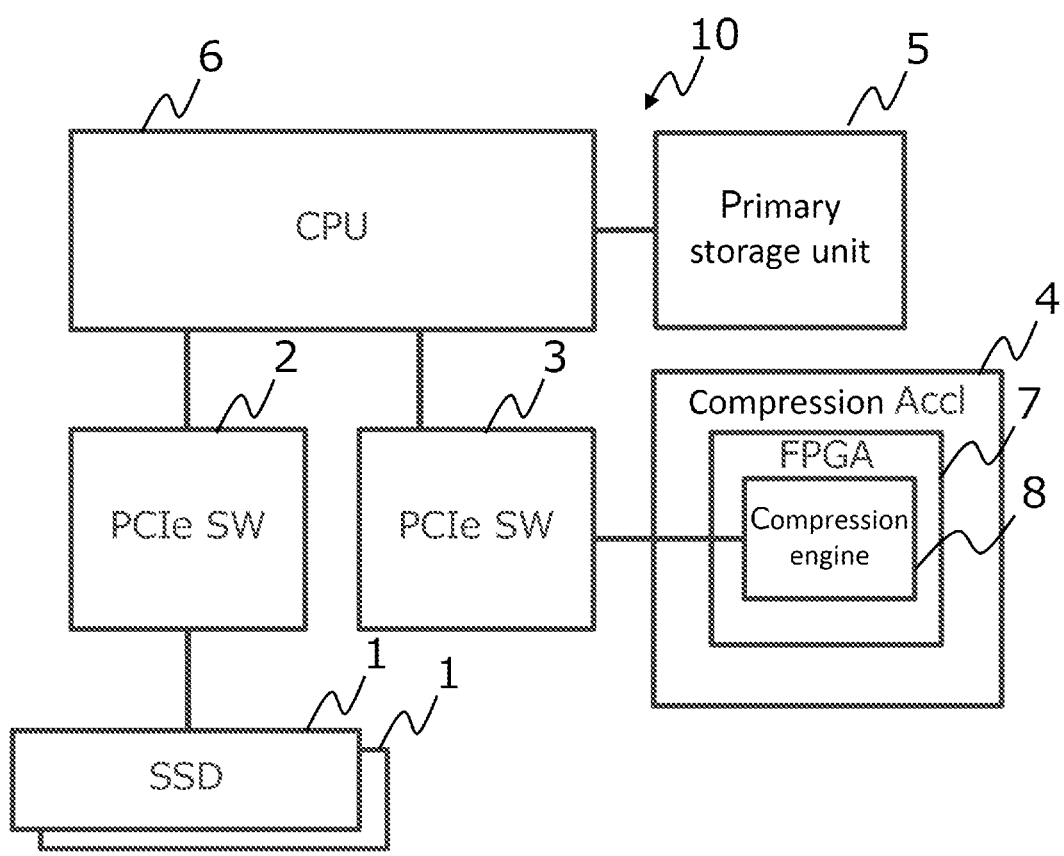
FIG. 1 illustrates the configuration of a storage system according to one embodiment of the present disclosure.

The following explains an embodiment of the present disclosure, referring to the drawings.

FIG. 1 illustrates the configuration of a storage system according to one embodiment of the present disclosure. A storage system 10 in FIG. 1 is a system that has the function of a data compression apparatus that compresses DIF-in cleartext data, which will be described later, and that includes an SSD (Solid State Drive) 1, PCIe (PCI express) switches 2 and 3, a compression accelerator (denoted as Compression Accl in the FIG. 4, a primary storage unit 5, and a CPU (Central Processing Unit) 6.

The SSD 1 is a data storage device (storage device) that stores data. Multiple SSDs 1 may be used. Meanwhile, a different type of device such as an HDD (Hard Disk Drive) may be used instead of an SSD as a data storage device, and alternatively, multiple kinds of devices may be used together.

The PCIe switch 2 is a relay device that relays communication between the SSD 1 and the CPU 6. The PCIe switch 3 is a relay device that relays communication between the SSD 1 and the compression accelerator 4. A different kind of relay device such as an SAS (Serial Attached SCS) switch may be used instead of the PCIe switches 2 and 3.

The compression accelerator 4 is a board for compressing data by using a dedicated circuit. The compression accelerator 4 in the present embodiment is provided with a FPGA (Field Programmable Gate Array) 7 as the dedicated circuit, and the FPGA 7 functions as a compression engine 8 that is a compression unit that compresses data. In addition, an ASIC (Application Specific Integrated Circuit) may be used as the dedicated circuit instead of the FPGA 7, and the compression engine may be configured in the CPU 6.

The primary storage unit 5 stores a program that defines the operation of the CPU 6, data to be written to the SSD 1, etc.

The CPU 6 is a control unit that reads the program stored in the primary storage unit 5, and executes the read program to fulfill various functions. The CPU 6, for example, receives a data write request from a not-illustrated host device, temporarily stores, in the primary storage unit 5, data to be written in response to the write request, causes the compression engine 8 of the compression accelerator 4 to compress the data to be written, and stores the compressed data in the SSD 1.

Figure 2:
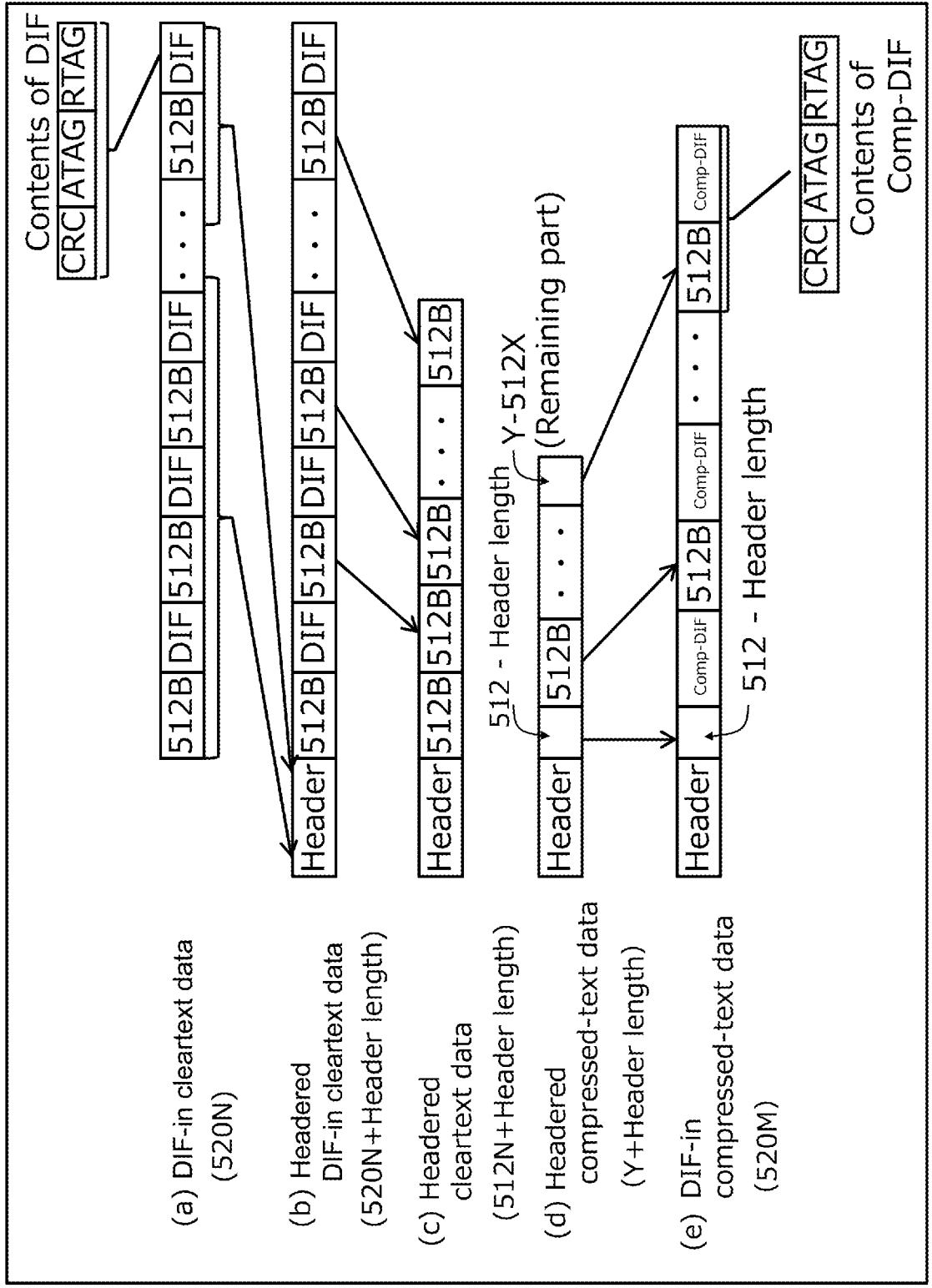
FIG. 2 is an illustration for explaining a compression process.

FIG. 2 is an illustration for explaining a compression process with the compression engine 8.

FIG. 2(*a*) indicates the data structure of data to be compressed. The data to be compressed is the foregoing data to be written, and is stored in the primary storage unit 5 with the CPU 6.

The data to be compressed as indicated in FIG. 2(*a*) is the DIF-in cleartext data (code-in cleartext data) in which pieces of DIF (Data Integrity Field) data including error detection codes based on cleartext data that is user data requested to be written are added to the cleartext data. Before stored in the primary storage unit 5 with the CPU 6, the cleartext data may be, for example, deduplicated with the CPU 6 or the like.

In the DIF-in cleartext data, pieces of DIF data are added to the cleartext data in data blocks of a reference data length each. The reference data length in the present embodiment is 512 bytes (B). In addition, each piece of DIF data is eight bytes long. Accordingly, assuming that the number of data blocks is N, the data length of the DIF-in cleartext data is 520N bytes.

Each piece of DIF data includes, specifically, a CRC (Cyclic Redundancy Check) code that is a first error detection code, an application tag (ATAG) capable of being arbitrarily configured with the storage system 10, and a reference tag (RTAG) that stores information on a logical address where the DIF-in cleartext data is stored. The CRC code in the present embodiment is a CRC-16 code that is a CRC code of 16 bits.

In the compression process, as indicated in FIG. 2(*b*), the compression engine 8 first calculates replacement CRC codes, which are second CRC codes, in predetermined data lengths that are each a predetermined data length, for the cleartext data included in the DIF-in cleartext data, and adds a header including the replacement CRC codes to the DIF-in cleartext data to generate headered DIF-in cleartext data.

The predetermined data length is preferably longer than the reference data length (512 bytes) of the data block. The predetermined data length is hereafter indicated in a multiple of the reference data length as multiplied by a predetermined number. In addition, the predetermined number is denoted as L, and can be called the number of pieces of CRC replacement data, and the predetermined data length can be called CRC replacement data length. In this case, the CRC replacement data length is 512 (bytes)×the number L of pieces of CRC replacement data×512=512L (bytes).

The replacement CRC codes are preferably CRC codes of a greater number of bits than the number of bits of original CRC codes (first CRC codes). The replacement CRC codes in the present embodiment is CRC-32 codes that are CRC codes of 32 bits. Note that the data length of the headered DIF-in cleartext data is 520N bytes+a header length.

Then, as indicated in FIG. 2(*c*), the compression engine 8 generates headered cleartext data by removing all of the (N) pieces of DIF data from the headered DIF-in cleartext data. As a result, the CRC codes are replaced. Note that the data length of the headered cleartext data is 512N bytes+the header length.

Next, as indicated in FIG. 2(*d*), the compression engine 8 generates compressed-text data by compressing part of the headered cleartext data that remains after removing the header therefrom, (i.e., the cleartext data), and generates headered compressed-text data by adding the header of the headered cleartext data to the generated compressed-text data. Assuming that the data length of the compressed-text data is Y, the data length of the headered compressed-text data is Y+the header length. Note that the compressed-text data includes no pieces of DIF data, and thus the compression ratio of the entire headered compressed-text data is higher than when the DIF-in cleartext data is simply compressed.

Then, as indicated in FIG. 2(*e*), the compression engine 8 calculates pieces of comp-DIF data that are pieces of DIF data based on the compressed-text data, and adds the pieces of comp-DIF data to the headered compressed-text data to generate DIF-in compressed-text data (code-in compressed-text data). In addition, each piece of comp-DIF data includes a CRC code that is a third error detection code, an application tag (ATAG), and a reference tag (RTAG). This CRC code in the present embodiment is a CRC-16 code that is a CRC code of 16 bits.

The pieces of comp-DIF data are added to the compressed-text data in data blocks of 512 bytes, as with the pieces of DIF data of the DIF-in cleartext data. Thus, the first piece of comp-DIF data is generated on the basis of the header and part of the compressed-text data that remains after deducting the bytes of the header length from 512 bytes. In addition, the data length of the headered compressed-text data is not always an integer multiple of 512 bytes. Assuming that the number of data blocks of 512 bytes included in the headered compressed-text data is X, the data length of the data block of a remaining part at the tail end is Y-512X. In generating the pieces of comp-DIF data, the compression engine 8 adds data of a predetermined value (for example, 0) to the tail end until the data length of the data block at the tail end becomes 512 bytes, and then, generates a piece of comp-DIF data corresponding to the data block at the tail end. As a result, in the headered compressed-text data, the number of data blocks becomes X+1=M, and the compression ratio of the headered compressed-text data is M/N.

Figure 3:
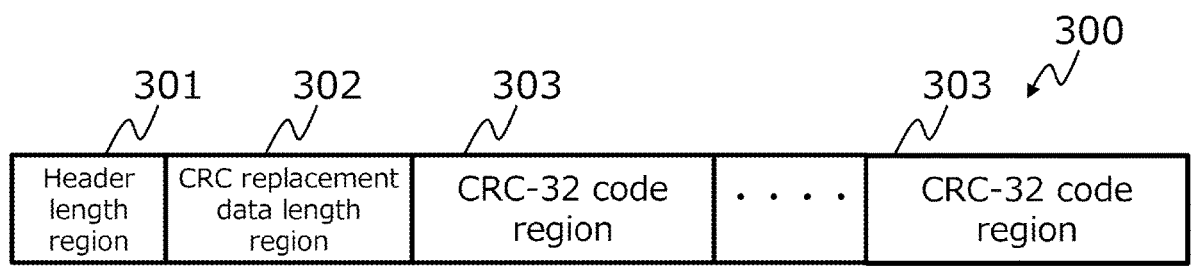
FIG. 3 illustrates one example of the configuration of a header.

FIG. 3 illustrates one example of the configuration of the header. As indicated in FIG. 3, a header 300 includes a header length region 301 that stores the header length, a CRC replacement data length region 302 that stores information indicting the CRC replacement data length (the CRC replacement data length itself, the number L of pieces of CRC replacement data, or the like), and CRC-32 code regions 303 that store the replacement CRC codes (CRC-32 codes). One CRC-32 code regions 303 is provided for one replacement CRC code.

The number L of pieces of CRC replacement data (i.e., the CRC replacement data length) may be fixed, be configured by a user or a manager, or be determined by the storage system 10. In addition, the number of replacement CRC codes varies according to the number L of pieces of CRC replacement data. For example, in the case where that the cleartext data is 32 k bytes long (N=64), when the CRC replacement data length assumes 4 k bytes (L=8), the number of replacement CRC codes is eight, and when the CRC replacement data length assumes 8 k bytes (L=16), the number of replacement CRC codes is four. Note that how to determine the CRC replacement data length with the storage system 10 will be described later.

Figure 4:
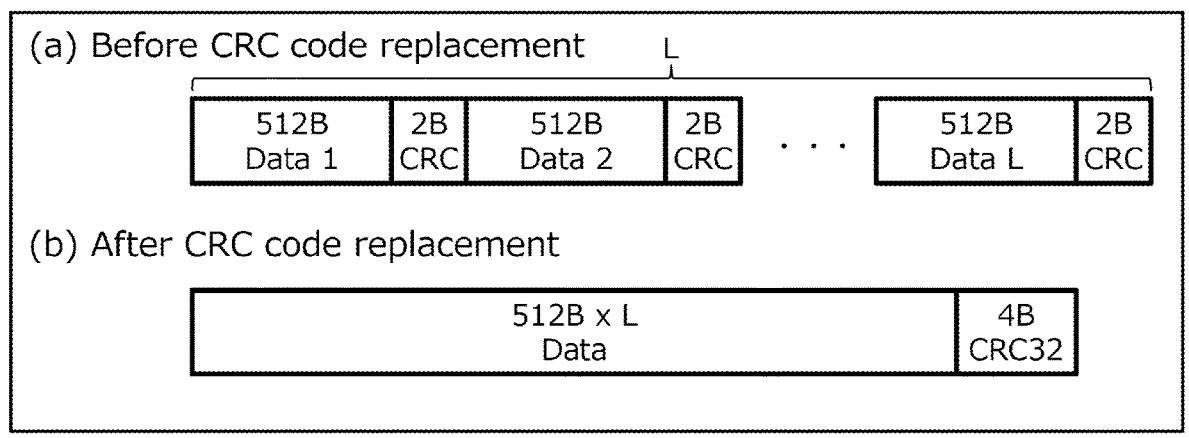
FIG. 4 is an illustration for explaining a change in data length resulting from replacement of CRC codes.

FIG. 4 is an illustration for explaining a change in data length resulting from replacement of the CRC codes. Specifically, FIG. 4(a) indicates the cleartext data as seen before the CRC code replacement, and FIG. 4(b) indicates the cleartext data as seen after the CRC code replacement. Note that tag information (the application tag and the reference tag), which is deleted at the time of compression, is omitted in FIG. 4.

As indicated in FIG. 4(a), L data blocks (Data 1 to L) of 512 bytes as seen before the CRC code replacement are each provided with a CRC-16 code of 2 bytes. Meanwhile, as indicated in FIG. 4(b), L data blocks of 512 bytes after the CRC code replacement are collectively provided with a single CRC-32 code (replacement CRC code) of 4 bytes. In this case, if the number L of pieces of CRC replacement data is greater than two, then the data length becomes shorter after the CRC code replacement than before the CRC code replacement.

Figure 5:
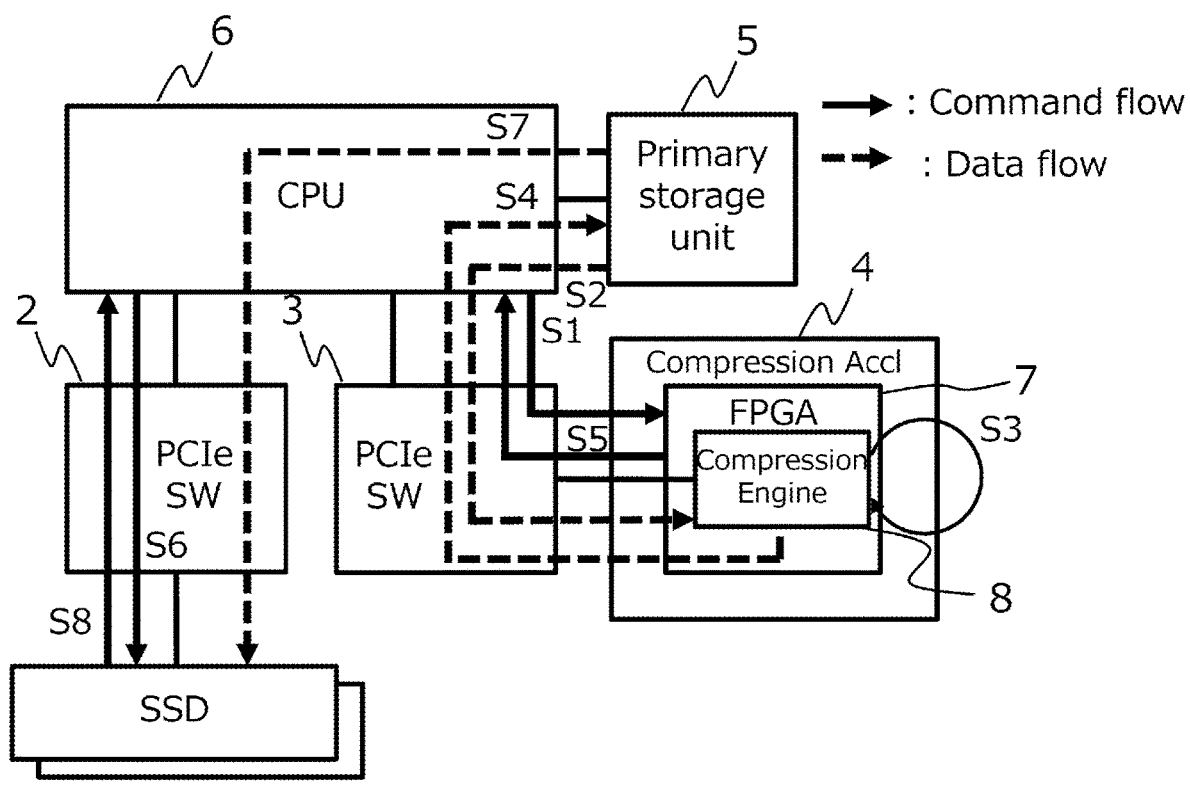
FIG. 5 illustrates one example of the flow of data as seen when the data is compressed.
Figure 6:
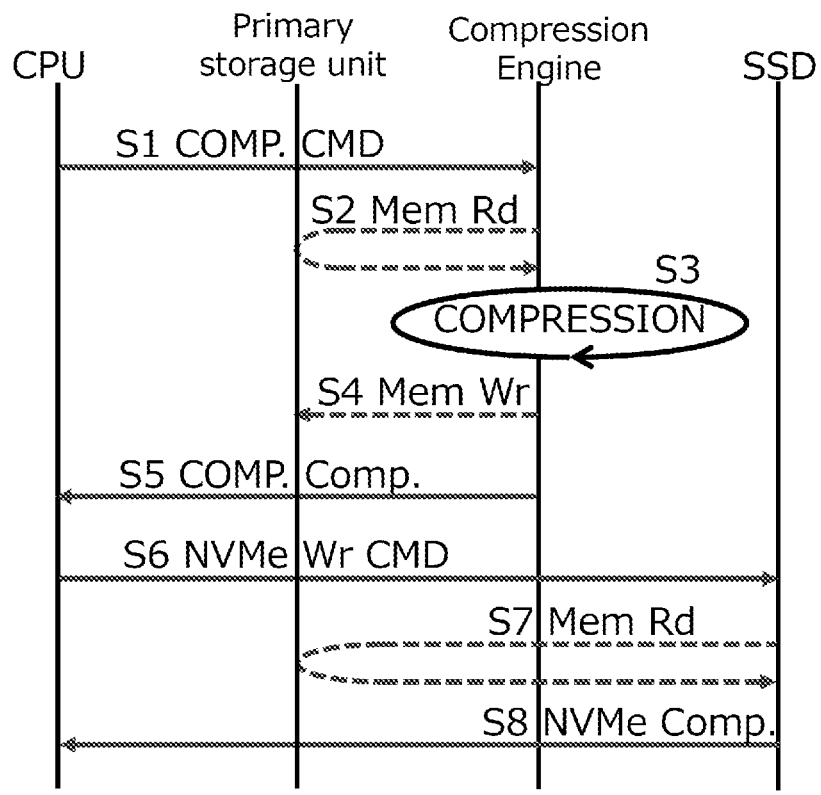
FIG. 6 is an illustration of a sequence for explaining one example of the operation of the storage system as seen when the data is compressed.

FIG. 5 illustrates one example of the flow of data as seen when the data is compressed. FIG. 6 is an illustration of a sequence for explaining the operation of the storage system 10 as seen when the data is compressed. Note that in FIG. 5 and FIG. 6, the flow of data is indicated with broken lines, and the flow of a command with solid lines.

As indicated in FIG. 5 and FIG. 6, the CPU 6 first outputs a compression command that requests the compression of data (DIF-in cleartext data) to the compression engine 8 via the PCIe switch 3 (step S1). In accordance with the compression command, the compression engine 8 reads the DIF-in cleartext data to be compressed from the primary storage unit 5 via the PCIe switch 3 and the CPU 6 (step S2). The compression engine 8 compresses the read DIF-in cleartext data (refer to FIG. 7) to generate the DIF-in compressed-text data (step S3).

The compression engine 8 writes the generated DIF-in compressed-text data to the primary storage unit 5 via the PCIe switch 3 and the CPU 6 (step S4). Then, the compression engine 8 outputs response information that indicates that data compression has been completed to the CPU 6 via the PCIe switch 3 (step S5).

On receiving the response information, the CPU 6 outputs a write command for writing the DIF-in compressed-text data generated by the compression engine 8 to the SSD 1 via the PCIe switch 2 (step S6). In accordance with the write command, the SSD 1 reads the DIF-in compressed-text data from the primary storage unit 5 via the PCIe switch 2 and the CPU 6, and writes this data to the SSD 1 itself (step S7). Then, the SSD 1 passes response information that indicates that the compressed-text data has been written to the CPU 6 via the PCIe switch 2 (step S8), and thus the process ends.

Figure 7:
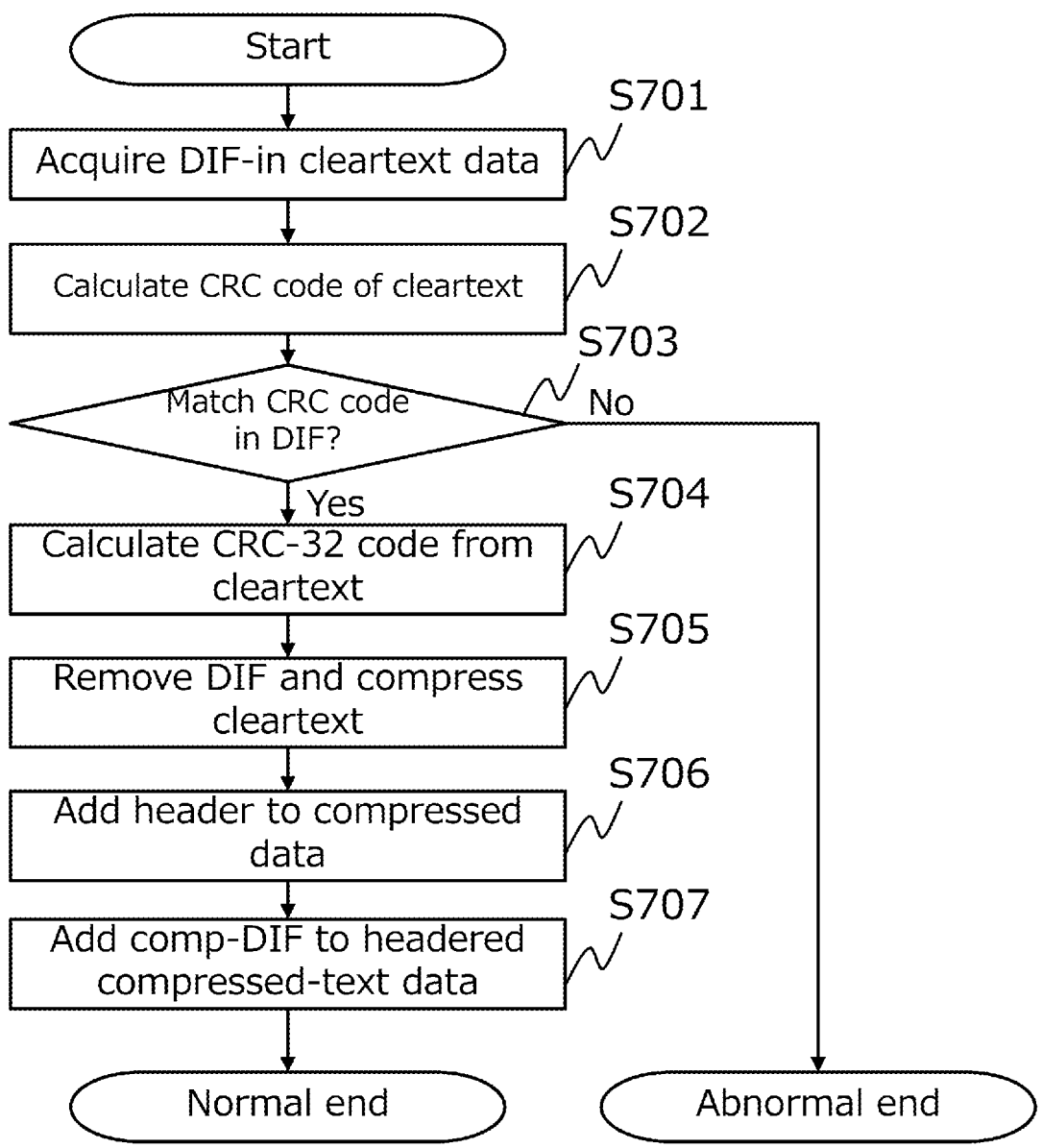
FIG. 7 is a flowchart for explaining one example of the compression process.

FIG. 7 is a flowchart for explaining one example of the compression process. Note that the step S701 in the following process corresponds to the step S2, and the steps S702 to S707 corresponds to the step S3.

In the compression process, the compression engine 8 first acquires, in accordance with the compression command from the CPU 6, the DIF-in cleartext data to be compressed from the primary storage unit 5 via the PCIe switch 3 and the CPU 6 (step S701). The compression engine 8 calculates a CRC code on the basis of each of the data blocks of the cleartext data included in the DIF-in cleartext data (step S702). The compression engine 8 determines, for each data block, whether the generated CRC code matches the CRC code included in each piece of DIF data of the DIF-in cleartext data (step S703).

In the case where the CRC codes match each other, the compression engine 8 determines that an error occurs in the cleartext data, and thus the process ends (abnormal end).

On the other hand, in the case where the CRC codes match each other, the compression engine 8 calculates replacement CRC codes for the cleartext data of the DIF-in cleartext data in CRC replacement data lengths, and adds the header including these replacement CRC codes to the DIF-in cleartext data to generate the headered DIF-in cleartext data (step S704). Note that the CRC replacement data length is, for example, set in advance, and fixed and specified, or alternatively, specified using the compression command by the CPU 6.

The compression engine 8 removes all of the pieces of DIF data from the headered DIF-in cleartext data to generate the headered cleartext data, and compresses the cleartext data of the generated headered cleartext data to generate the compressed-text data (step S705).

The compression engine 8 adds the header of the headered cleartext data to the compressed-text data to generate the headered compressed-text data (step S706). The compression engine 8 calculates pieces of comp-DIF data that are pieces of DIF data based on the compressed-text data, and adds the pieces of comp-DIF data to the headered compressed-text data to output this as the DIF-in compressed-text data (step S707), and thus the process ends (normal end).

Figure 8:
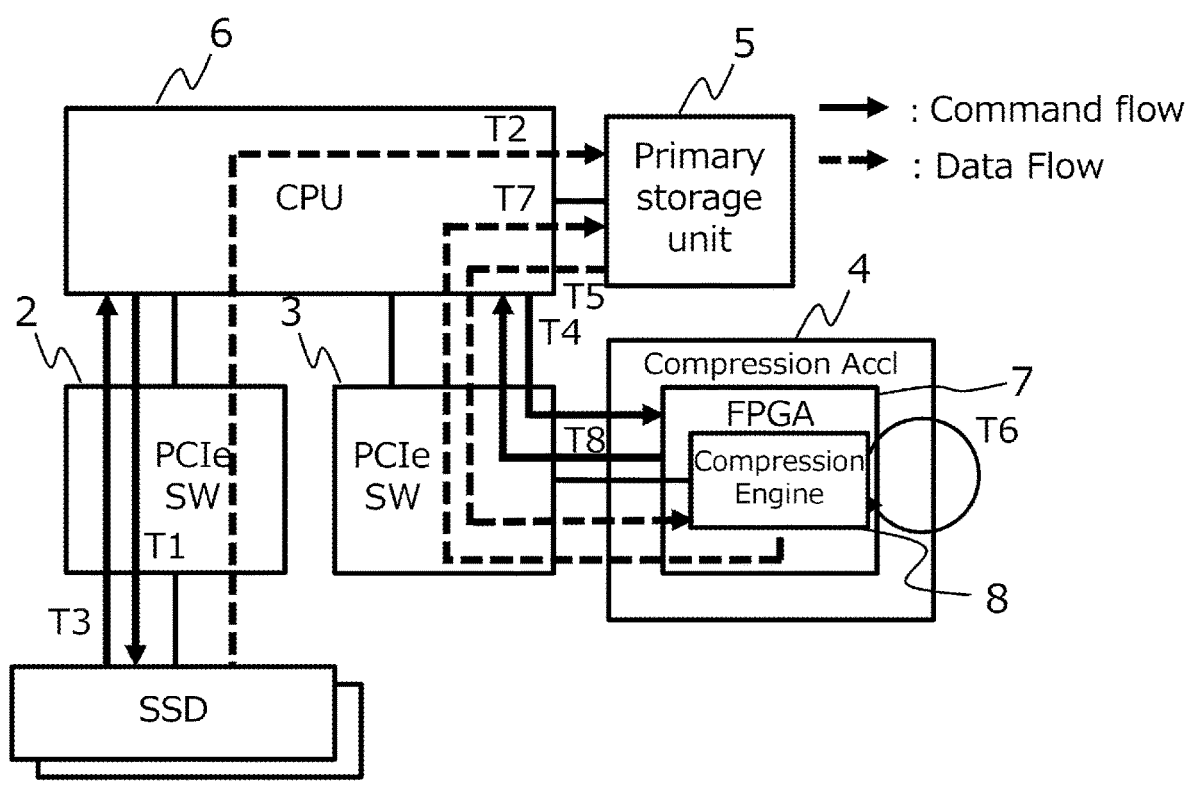
FIG. 8 illustrates one example of the flow of data as seen when the data is decompressed.
Figure 9:
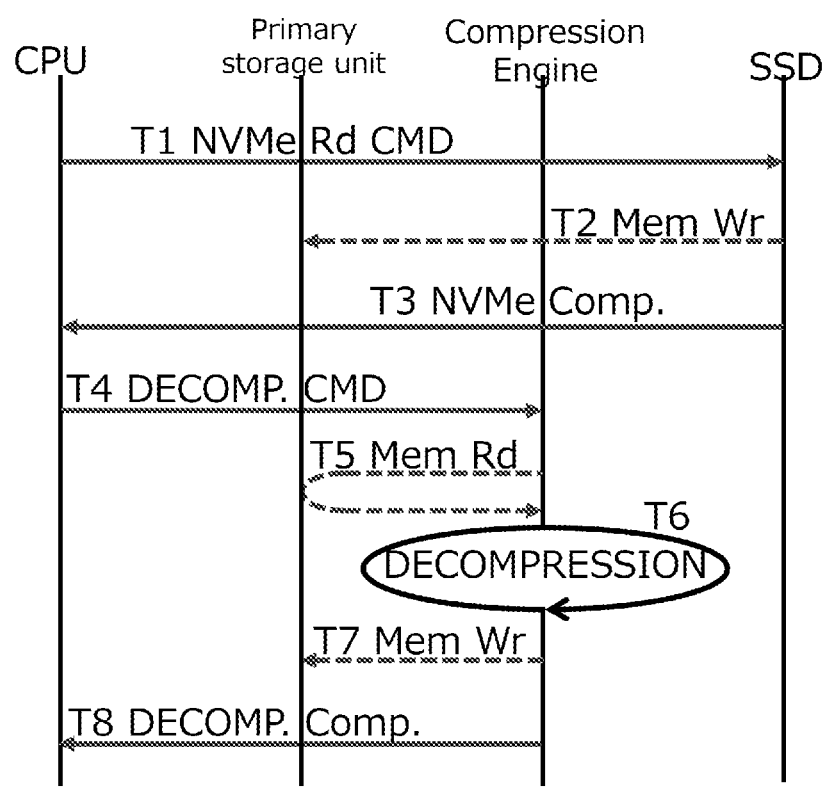
FIG. 9 is an illustration of a sequence for explaining one example of the operation of the storage system as seen when the data is decompressed.

FIG. 8 illustrates one example of the flow of data as seen when the data is decompressed. FIG. 9 is an illustration of a sequence for explaining one example of the operation of the storage system 10 as seen when the data is decompressed. Note that in FIG. 8 and FIG. 9, the flow of data is indicated with broken lines, and the flow of a command with solid lines.

As indicated in FIG. 8 and FIG. 9, the CPU 6 first transmits a read command for reading the DIF-in compressed-text data to the SSD 1 via the PCIe switch 2 (step T1). In accordance with the read command, the SSD 1 reads the stored DIF-in compressed-text data to the primary storage unit 5 via the PCIe switch 2 and the CPU 6 (step T2). Then, the SSD 1 outputs response information that indicates that the compressed-text data has been read to the CPU 6 via the PCIe switch 2 (step T3).

On receiving the response information, the CPU 6 outputs a decompress command that requests the decompression of the DIF-in compressed-text data to the compression engine 8 via the PCIe switch 3 (step T4). In accordance with the decompression command, the compression engine 8 reads the DIF-in compressed-text data to be decompressed from the primary storage unit 5 via the PCIe switch 3 and the CPU 6 (step T5). The compression engine 8 decompresses the DIF-in compressed-text data (refer to FIG. 10) to generate the DIF-in cleartext data (step T6).

The compression engine 8 writes the generated DIF-in cleartext data to the primary storage unit 5 via the PCIe switch 3 and the CPU 6 (step T7). Then, the compression engine 8 passes response information that indicates that compressed-text data decompression has been completed to the CPU 6 via the PCIe switch 3 (step T8).

Figure 10:
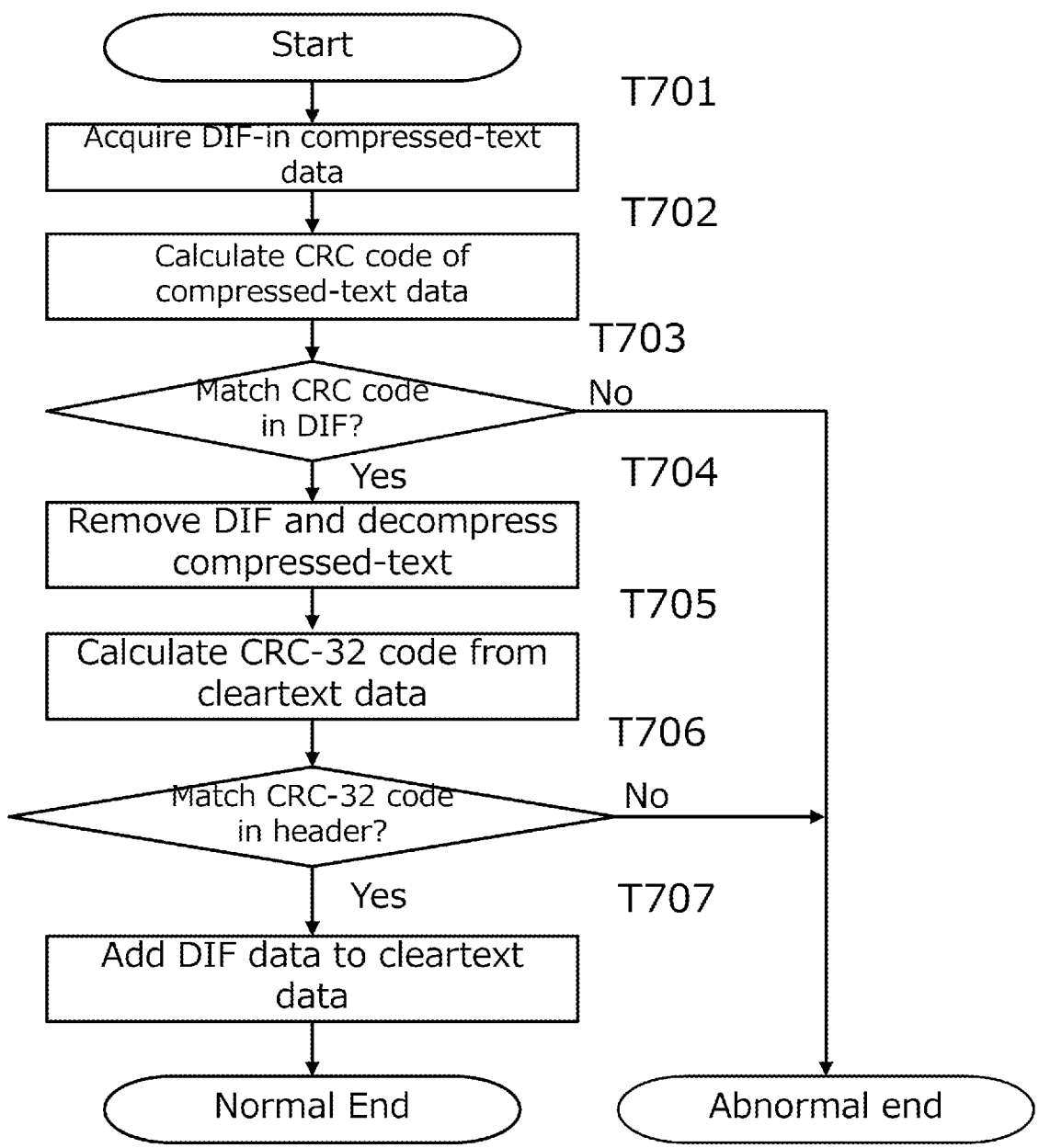
FIG. 10 is a flowchart for explaining one example of the decompression process.

FIG. 10 is a flowchart for explaining one example of the decompression process. Note that the step T701 in the following process corresponds to the step T5, and the steps T702 to T707 correspond to the step T6.

In the decompression process, the compression engine 8 first acquires, in accordance with the decompression command from the CPU 6, the DIF-in compressed-text data to be decompressed from the primary storage unit 5 via the PCIe switch 3 and the CPU 6 (step T701). The compression engine 8 calculates a CRC code on the basis of each of the data blocks of the compressed-text data included in the DIF-in compressed-text data (step T702). The compression engine 8 determines, for each data block, whether the generated CRC code matches the CRC code included in each piece of comp-DIF data of the DIF-in compressed-text data (step T703).

In the case where the CRC codes do not match each other, the compression engine 8 determines that an error occurs in the compressed-text data, and thus the process ends (abnormal end).

On the other hand, in the case where the CRC codes match each other, the compression engine 8 removes all of the pieces of comp-DIF data from the DIF-in compressed-text data to generate the headered compressed-text data, and decompresses the compressed-text data of the headered compressed-text data to generate the cleartext data (step T704).

The compression engine 8 calculates replacement CRC codes (CRC-32 code) for the cleartext data in CRC replacement data lengths (step T705). The compression engine 8 determines whether the generated replacement CRC codes match the replacement CRC codes included in the header of the headered compressed-text data (step T706).

In the case where the replacement CRC codes do not match each other, the compression engine 8 determines that an error occurs in the cleartext data, and thus the process ends (abnormal end).

In the other hand, in the case where the replacement CRC codes match each other, the compression engine 8 calculates pieces of DIF data based on the cleartext data, and adds the pieces of DIF data to the cleartext data to output this as the DIF-in cleartext data (step T707), and thus the process ends (normal end).

FIG. 11 is an illustration for explaining one example of a method for determining a CRC-replacement data length.

The CPU 6 determines the CRC replacement data length such that a data error nondetection probability, which refers to the probability that an error of the cleartext data cannot be detected with the replacement CRC codes, does not exceed a predetermined allowable value.

Specifically, as indicated in FIG. 11, the following two are calculated: a data error ratio of cleartext data formed by aligning S data blocks having a block length of 512 bytes each; and a data error nondetection probability with the replacement CRC codes on the basis of this data error ratio. Assuming that a bit error ratio is BER, the data error ratio is $512 \times S \times 8 \times BER$. Assuming that an error detection probability with the CRC-32 codes is D, the data error nondetection probability is $512 \times S \times 8 \times BER \times (1-D)$. Note that the bit error ratio BER and the error detection probability D vary depending on the specification or the like of the storage system 10.

Thus, the data error nondetection probability increases as S increases. The data error nondetection probability exceeds the allowable value depending on what value S assumes.

FIG. 11 indicates an example in which if S assumes a value of 1 to A, then the data error nondetection probability does not exceed the allowable value, and if S assumes a value of A+1, then the data error nondetection probability exceeds the allowable value. In this case, any of the values of S that does not allow the nondetection probability to exceed the allowable value is determined as the number L of pieces of CRC replacement data, and accordingly, the CRC replacement data length is determined to be 512L. For example, a maximum value (=A) of S that does not allow the nondetection probability to exceed the allowable value is determined as the number L of pieces of CRC replacement data.

As explained above, the compression engine 8 according to the present embodiment calculates replacement CRC codes, in the predetermined data lengths, for DIF-in cleartext data including the cleartext data and multiple CRC codes based on the cleartext data. The compression engine 8 generates the headered compressed-text data in which the header including the replacement CRC codes is added to the compressed-text data in which the cleartext data is compressed, and generates the code-in compressed-text data by calculating multiple CRC codes based on the headered compressed-text data to add the calculated CRC codes to the headered compressed-text data.

Thus, the cleartext data in which the CRC codes are removed is compressed, enhancing the compression ratio. In addition, the CRC codes are replaced, thus reducing the amount of data in comparison with the case where the CRC codes are stored without being replaced. Furthermore, the header including the replacement CRC codes capable of detecting an error of the cleartext data is added to the compressed-text data. This enables decompression of the compressed-text data and error detection even in a processing unit of a storage system that is the copy destination of remote copy of the data, and an arbitrarily-given processing unit such as a front end processor that connects with the copy destination of remote copy. These features furthermore enhances the compression ratio, reliability, and portability of data.

In the present embodiment, whether to deduplicate the cleartext data in advance can arbitrarily be determined. However, such advance deduplication would reduce the number of CRC codes to be removed, thus alleviating the load of processing.

In addition, in the present embodiment, the CRC codes included in the DIF-in cleartext data are generated on the basis of the cleartext data in reference data lengths that are each the reference data length. In addition, the predetermined data length is longer than the reference data length. This makes replacement CRC codes fewer than original CRC codes, thus enhancing the compression ratio of data more appropriately.

In addition, the number of bits of each replacement CRC code in the present embodiment is greater than the number of bits of each CRC code included in the DIF-in cleartext data. This ensures the reliability of the cleartext data even if the predetermined data length is longer than the reference data length.

In addition, the predetermined data length in the present embodiment is determined such that the probability that an error of the cleartext data cannot be detected with the replacement CRC codes does not exceed a predetermined allowable value. This allows the predetermined data length to be set to an appropriate value.

In addition, the header in the present embodiment includes information indicating the predetermined data length. This enables decompression of the compressed-text data and error detection in an arbitrarily-given processing unit even if the predetermined data length is not fixed.

In addition, the primary storage unit 5 in the present embodiment stores the DIF-in cleartext data. In compressing code-in cleartext data, the compression engine 8 reads the DIF-in cleartext data from the primary storage unit 5, generates the code-in compressed-text data corresponding to the DIF-in cleartext data, and writes thus generated DIF-in compressed-text data, in turn, to the primary storage unit 5. In decompressing code-in compressed-text data, the compression engine 8 reads the code-in compressed-text data from the primary storage unit 5, generates the code-in cleartext data in which the code-in compressed-text data is decompressed, and writes the code-in cleartext data, in turn, to the primary storage unit 5. This process enables the data to be compressed and decompressed before and after the data is stored in the SSD 1, or at any appropriate timing.

The above-mentioned aspects of the embodiment of the present disclosure are indicated as examples for explaining the present disclosure, and are not intended to mean that the scope of the present disclosure is limited to these aspects alone. A person skilled in the art could carry out the present disclosure in other various modes without departing from the scope of the present disclosure.

For example, the data may be compressed and decompressed with the CPU 6. In this case, the CPU 6 serves as a control unit and also as a compression unit, and as a result, the compression accelerator 4 can be eliminated.

What is claimed is:

1. A data compression apparatus that compresses code-in cleartext data including cleartext data and multiple first error detection codes based on the cleartext data, the device comprising:
   a compression unit configured to calculate second error detection codes for the code-in cleartext data in predetermined data lengths that are each a predetermined data length, generate headered compressed-text data in which a header including the second error detection codes is added to compressed-text data in which the cleartext data is compressed, and generate code-in compressed-text data by calculating multiple third error detection codes based on the headered compressed-text data to add the calculated third error detection codes to the headered compressed-text data.

2. The data compression apparatus according to claim 1, wherein the first error detection codes are generated on the basis of the cleartext data in reference data lengths that are each a reference data length, and the predetermined data length is longer than the reference data length.

3. The data compression apparatus according to claim 2, wherein the number of bits of each second error detection code is greater than the number of bits of each first error detection code.

4. The data compression apparatus according to claim 1, further including a control unit configured to determine the predetermined data length such that a probability that an error of the cleartext data cannot be detected with the second error detection codes does not exceed a predetermined allowable value.

5. The data compression apparatus according to claim 4, wherein the header includes information indicating the predetermined data length.

6. The data compression apparatus according to claim 1, further including a primary storage unit configured to store the code-in cleartext data, wherein:
   in compressing the code-in cleartext data, the compression unit is configured to read the code-in cleartext data from the primary storage unit, generate the code-in compressed-text data corresponding to the code-in cleartext data, and write back the code-in compressed-text data to the primary storage unit, and
   in decompressing the code-in compressed-text data, the compression unit is configured to read the code-in compressed-text data from the primary storage unit, decompress the read code-in compressed-text data to generate the code-in cleartext data, and write back the generated code-in cleartext data to the primary storage unit.

7. A data compression method with a data compression apparatus for compressing code-in cleartext data including cleartext data and multiple first error detection codes based on the cleartext data, the method comprising:
   calculating second error detection codes for the code-in cleartext data in predetermined data lengths that are each a predetermined data length;
   generating headered compressed-text data in which a header including the second error detection codes is added to compressed-text data in which the cleartext data is compressed; and
   generating code-in compressed-text data by calculating multiple third error detection codes based on the headered compressed-text data to add the third error detection codes to the headered compressed-text data.

* * * * *